(12) United States Patent
Guo

(10) Patent No.: US 10,509,146 B2
(45) Date of Patent: Dec. 17, 2019

(54) SUBSTRATE AND FABRICATION METHOD THEREOF, DISPLAY PANEL AND DISPLAY DEVICE

(71) Applicants: BOE Technology Group Co., Ltd., Beijing (CN); Hefei BOE Optoelectronics Technology Co., Ltd., Hefei (CN)

(72) Inventor: Yuanhui Guo, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 282 days.

(21) Appl. No.: 15/515,935

(22) PCT Filed: Jan. 21, 2016

(86) PCT No.: PCT/CN2016/071617
§ 371 (c)(1),
(2) Date: Mar. 30, 2017

(87) PCT Pub. No.: WO2017/031939
PCT Pub. Date: Mar. 2, 2017

(65) Prior Publication Data
US 2017/0299773 A1    Oct. 19, 2017

(30) Foreign Application Priority Data

Aug. 21, 2015    (CN) .......................... 2015 1 0518760

(51) Int. Cl.
*G02B 1/10*    (2015.01)
*G03F 7/00*    (2006.01)
(Continued)

(52) U.S. Cl.
CPC ............. *G02B 1/10* (2013.01); *G03F 7/0035* (2013.01); *H01L 27/1248* (2013.01);
(Continued)

(58) Field of Classification Search
CPC ..... G03F 7/0007; G03F 7/0035; G02B 5/201; G02B 5/223; G02B 1/10; G02F 1/133512;
(Continued)

(56) References Cited

U.S. PATENT DOCUMENTS

| 6,356,326 | B1 | 3/2002 | Tamura et al. |
| 2005/0140873 | A1* | 6/2005 | Hong ..................... G02B 6/06 |
| | | | 349/114 |
| 2015/0362793 | A1* | 12/2015 | Ishihara ............ G02F 1/133512 |
| | | | 349/43 |

FOREIGN PATENT DOCUMENTS

| CN | 1201160 A | 12/1998 |
| CN | 1291298 A | 4/2001 |

(Continued)

OTHER PUBLICATIONS

Computer-generated translation of CN 102736315 (Oct. 2012). (Year: 2012).*

(Continued)

*Primary Examiner* — John A McPherson
(74) *Attorney, Agent, or Firm* — Banner & Witcoff, Ltd.

(57) ABSTRACT

A substrate and manufacturing method therefor, a display panel, and a display device. The substrate comprises a substrate base; and a first organic film and a second organic film which are located on the substrate base, wherein the first organic film and second organic film are used as a flat layer, and the refractive index of the first organic film is different from that of the second organic film. The first organic film and the second organic film are constructed such that after (Continued)

incident light obliquely incident on the substrate passes through the first organic film and the second organic film, emergent light of the incident light is deflected to the direction away from the substrate.

12 Claims, 8 Drawing Sheets

(51) Int. Cl.
*H01L 27/12* (2006.01)
*G02F 1/1335* (2006.01)
*G02F 1/1362* (2006.01)
*G02F 1/1333* (2006.01)
*H01L 27/32* (2006.01)
*H01L 51/52* (2006.01)

(52) U.S. Cl.
CPC .. *G02F 1/133512* (2013.01); *G02F 1/133514* (2013.01); *G02F 1/133516* (2013.01); *G02F 1/136286* (2013.01); *G02F 2001/133357* (2013.01); *G03F 7/0007* (2013.01); *H01L 27/322* (2013.01); *H01L 27/3258* (2013.01); *H01L 51/5275* (2013.01); *H01L 51/5284* (2013.01)

(58) Field of Classification Search
CPC ......... G02F 1/133514; G02F 1/133516; G02F 2001/133357; G02F 2201/40; H01L 27/322; H01L 51/5275
USPC ..................................................... 430/7, 321
See application file for complete search history.

(56) References Cited

FOREIGN PATENT DOCUMENTS

| | | |
|---|---|---|
| CN | 101419303 A | 4/2009 |
| CN | 102736315 A | 10/2012 |
| CN | 103454808 A | 12/2013 |
| CN | 105093652 A | 11/2015 |
| JP | 2007240932 A | 9/2007 |

OTHER PUBLICATIONS

Computer-generated translation of CN 103454808 (Dec. 2013). (Year: 2013).*

May 27, 2016—(WO) International Search Report and Written Opinion Appn PCT/CN2016/071617 with English Tran.

Jul. 31, 2017—(CN) First Office Action Appn 201510518760.6 with English Tran.

* cited by examiner

SUBSTRATE AND FABRICATION METHOD THEREOF, DISPLAY PANEL AND DISPLAY DEVICE

The application is a U.S. National Phase Entry of International Application No. PCT/CN2016/071617 filed on Jan. 21, 2016, designating the United States of America and claiming priority to Chinese Patent Application No. 201510518760.6 filed on Aug. 21, 2015. The present application claims priority to and the benefit of the above-identified applications and the above-identified applications are incorporated by reference herein in their entirety.

TECHNICAL FIELD

Embodiments of the present disclosure relate to a substrate and a fabrication method thereof, a display panel and a display device.

BACKGROUND

Thin Film Transistor Liquid Crystal Display (TFT-LCD) is a commonly used flat panel display at present. The liquid crystal display panels are widely used in modern digital information devices due to advantages such as small size, low power consumption, no radiation and high resolution.

As resolution of a product becomes higher and higher, a size of a pixel becomes smaller and smaller, an aperture ratio of the product becomes smaller and smaller, and usually, a designer can increase the aperture ratio by reducing a width of a black matrix; however, reduction of the width of the black matrix results in generation of a cross color defect. In addition, as a color gamut of the product increases, a color filter layer becomes thicker and thicker, resulting in that a distance between a light source and the black matrix becomes greater and greater, which further exacerbates a risk of the cross color defect.

A cross color phenomenon in the prior art is shown in FIG. 1, a liquid crystal display panel includes an array substrate 11 and a color filter substrate 12 arranged opposite to each other, wherein, the array substrate 11 includes a base substrate 13, a data line 14, and an organic film 15; and the color filter substrate 12 includes a base substrate 13, a black matrix 16, a color filter layer 17 and a protective layer 18, and the color filter layer 17 includes a red (R) color filter 171, a green (G) color filter 172 and a blue (B) color filter 173. When an observer views from the front, a light is emitted from a region of the R color filter 171, and at this time, a color of an image seen by the observer is red, but when the observer views from a side with a certain side viewing angle, part of the light easily enters a peripheral pixel region, as shown in the figure, light 10 is emitted from a region of the G color filter 172, and colors of the image seen by the observer are red and green, that is, at this time, the cross color defect occurs in the image viewed by the observer.

In summary, in the prior art, when the observer views the liquid crystal display panel at different side viewing angles, different colors will be seen, and the liquid crystal display panel in the art can generate the cross color defect.

SUMMARY

Embodiments of the present disclosure provide a substrate and a fabrication method thereof, a display panel and a display device, so as to avoid generation of a cross color defect at a side viewing angle.

In an aspect, an embodiment of the present disclosure provides a substrate, including: a base substrate; a first organic film and a second organic film, located on the base substrate and configured to be planarization layers, a refractive index of the first organic film being different from that of the second organic film, wherein, the first organic film and the second organic film are configured such that an emergent light from the incident light obliquely incident into the substrate and passing through an interface between the first organic film and the second organic film is deflected towards a direction away from the substrate.

In another aspect, an embodiment of the present disclosure provides a display panel, wherein the display panel includes the above described substrate.

In yet another aspect, an embodiment of the present disclosure provides a display device, wherein the display device includes the above described display panel.

In yet another aspect, an embodiment of the present disclosure provides a fabrication method of a substrate, including: providing a base substrate; forming a first organic film and a second organic film on the base substrate, wherein the first organic film and the second organic film are configured to be planarization layers, and a refractive index of the first organic film is different from that of the second organic film, the first organic film and the second organic film are configured such that an emergent light from the incident light obliquely incident into the substrate and passing through an interface between the first organic film and the second organic film is deflected towards a direction away from the substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
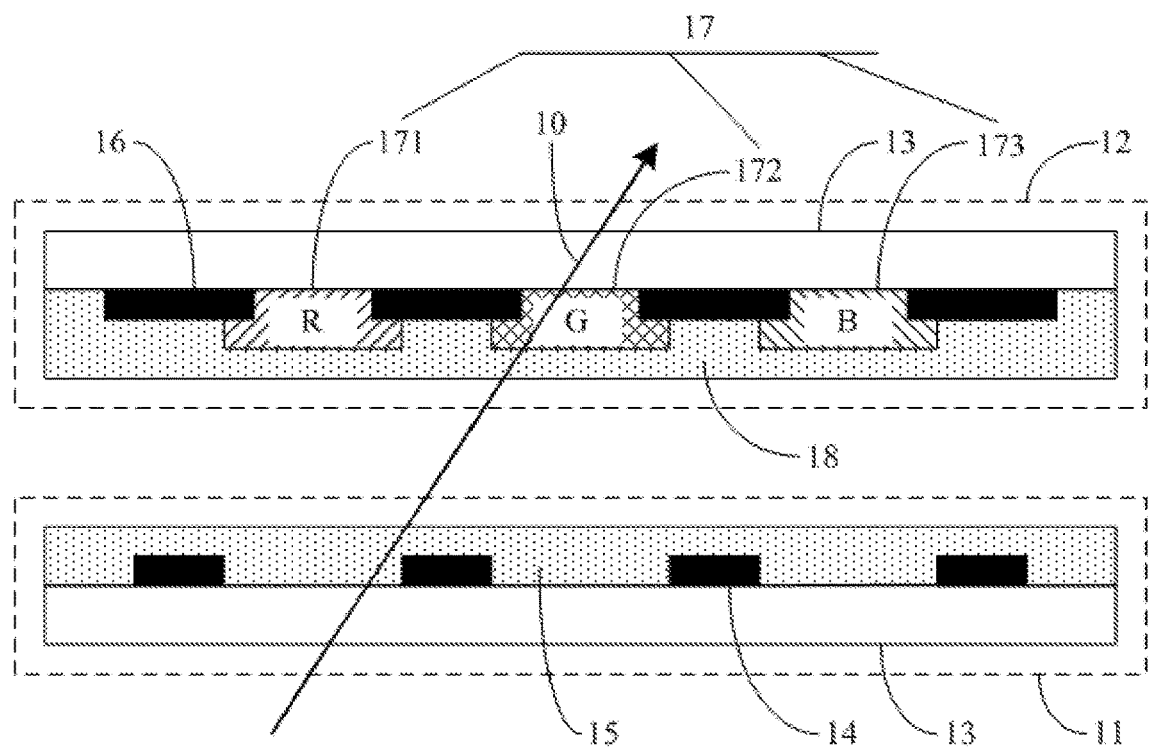
FIG. 1 is a cross-sectional structural schematic diagram of a display panel in the prior art.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiments of the present disclosure provide a substrate and a fabrication method thereof, a display panel and a display device, so as to prevent generation of a cross color defect at a side viewing angle.

In order to make the objective, technical solutions and advantages of the present disclosure clearer, the embodiments of the present disclosure are further described in detail hereinafter in conjunction with the accompanying drawings; and it is obvious that the described embodiments are just part of rather than all of the embodiments of the present disclosure. Based on the described embodiments herein, those ordinarily skilled in the art can obtain other embodiment(s), without any inventive work, which should be within the scope of the present disclosure.

Thicknesses, regional sizes and regional shapes of respective film layers in the drawings do not reflect a true scale of respective film layers, and only aims to schematically illustrate contents of the present disclosure.

A substrate provided by the embodiment of the present disclosure will be illustrated in detail in conjunction with the drawings below.

The substrate provided by specific embodiments of the present disclosure is an array substrate or a color filter substrate, and hereinafter, it is specifically illustrated respectively with the array substrate and the color filter substrate as an example.

Embodiment One

Figure 2:
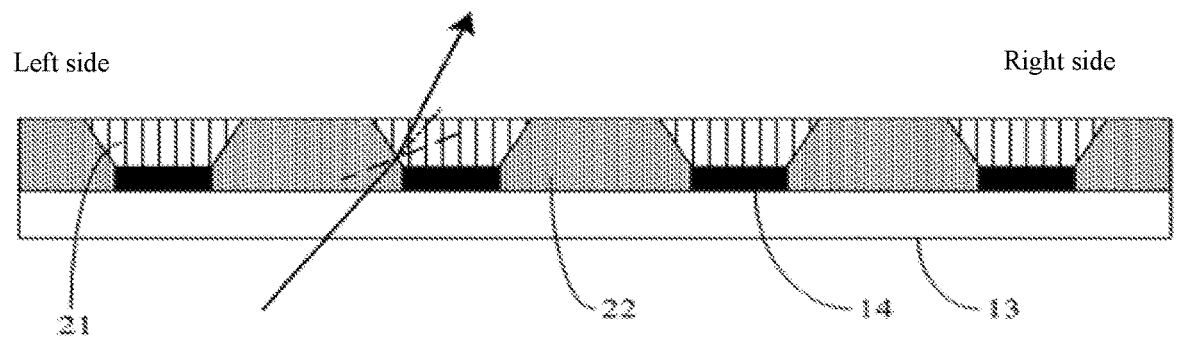
FIG. 2 is a cross-sectional structural schematic diagram of an array substrate provided by an embodiment of the present disclosure.
Figure 4:
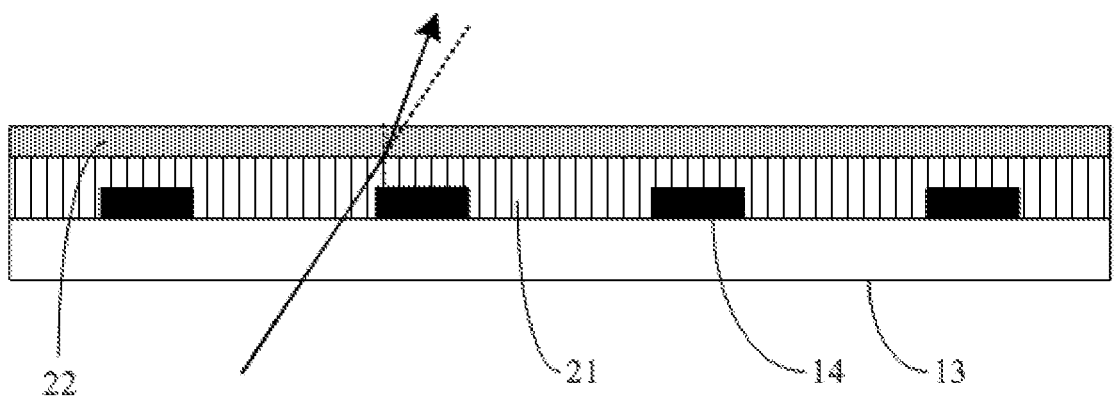
FIG. 4 is a cross-sectional structural schematic diagram of another array substrate provided by an embodiment of the present disclosure.

As shown in FIG. 2 and FIG. 4, a specific embodiment of the present disclosure provides a substrate which is an array substrate, including: a data line 14, a first organic film 21 and a second organic film 22 located on a base substrate 13. The first organic film 21 and the second organic film 22 are configured to be planarization layers, a refractive index of the first organic film 21 being different from a refractive index of the second organic film 22. The first organic film 21 and the second organic film 22 are configured such that an emergent light from the incident light obliquely incident into the substrate and passing through an interface between the first organic film 21 and the second organic film 22 is deflected towards a direction away from the substrate.

Exemplarily, the first organic film 21 and the second organic film 22 in the embodiment of the present disclosure alternately arranged in contact with each other in a same layer. As shown in FIG. 2, the incident light obliquely incident into the array substrate is refracted at the interface between the first organic film 21 and the second organic film 22, and the refractive index of the second organic film 22 is larger than the refractive index of the first organic film 21. Or, the first organic film 21 and the second organic film 22 in the embodiment of the present disclosure are stacked, the first organic film 21 is located below the second organic film 22, as shown in FIG. 4. The incident light obliquely incident into the array substrate is refracted at the interface between the first organic film 21 and the second organic film 22, and the refractive index of the second organic film 22 is larger than the refractive index of the first organic film 21.

As shown in FIG. 2, the first organic film 21 and the second organic film 22 in the array substrate provided by the specific embodiment of the present disclosure are configured to be planarization layers, so as to play a role in planarization when other film layers are formed on the array substrate, so that film layers subsequently formed have a better performance. When an incident light incident into a display region with a certain inclination angle passes through the interface between the first organic film 21 and the second organic film 22, an included angle between the incident light and a normal line of the interface is smaller than an included angle between an emergent light and the normal line of the interface, wherein, the inclination angle is equal to an included angle between an eye of the observer when observing the array substrate and the array substrate. Thus, the emergent light passed through the interface is deflected towards another edge opposite to an edge of the substrate towards which the incident light is inclined. With reference to FIG. 2, the incident light is inclined towards a right side of the substrate, and the emergent light passed through the interface is deflected to a left side of the substrate with respect to the incident light.

Exemplarily, when the first organic film 21 and the second organic film 22 in the embodiment of the present disclosure alternately arranged in contact with each other in a same layer, since the first organic film 21 and the second organic film 22 in the embodiment of the present disclosure have different refractive indexes, light incident into the array substrate, when passing through the interface between the first organic film 21 and the second organic film 22, will generate a refraction phenomenon; when the incident light incident into the display region with a certain inclination angle passes through the interface between the first organic film 21 and the second organic film 22, the emergent light of the incident light has its direction deflected as shown in FIG. 2. As compared with the prior art, the organic film in the embodiment of the present disclosure is made of two organic film materials of different refractive indexes, so that a propagation direction of the light incident into the display region of the array substrate can be changed.

Exemplarily, as shown in FIG. 2, in the embodiment of the present disclosure, a region of the second organic film 22 is provided corresponding to a pixel region, and a region of the first organic film 21 is provided corresponding to a region outside the pixel region. For example, in actual design, the first organic film 21 can be provided in a region corresponding to a non-display region between pixel units, and the second organic film 22 can be provided in the region corresponding to the pixel unit.

Exemplarily, as shown in FIG. 2, a cross-sectional shape of the first organic film 21 in the embodiment of the present disclosure is an inverted trapezoid, and an included angle between a waist of the inverted trapezoid and a horizontal direction is greater than or equal to 30 degrees; in actual design, the inverted trapezoid may be designed as an isosceles trapezoid. In actual design, the cross-sectional shape of the first organic film 21 in the embodiment of the present disclosure can also be a rectangle.

It is noted here that, the inverted trapezoid in the embodiment of the present disclosure refers to that, as viewed from a cross-sectional view, an upper base thereof is longer than a lower base, but a trapezoid has the upper base shorter than the lower base.

Exemplarily, when the first organic film 21 and the second organic film 22 according to the embodiment of the present disclosure are stacked, as shown in FIG. 4, the second organic film 22 covers the first organic film 21, for example, in the embodiment of the present disclosure, an orthographic projection of the first organic film 21 on the base substrate 13 and an orthographic projection of the second organic film 22 on the base substrate 13 are the same in area; and of course, in actual design, the orthographic projection of the first organic film 21 on the base substrate 13 and the orthographic projection of the second organic film 22 on the base substrate 13 may also different in area.

The first organic film 21 in the embodiment of the present disclosure is configured to be a planarization layer, so that the second organic film 22 subsequently fabricated has a better performance; and the second organic film 22 is configured to be a planarization layer, so that a film layer subsequently fabricated has a better performance. When the incident light incident into the display region with a certain inclination angle passes through the interface between the first organic film 21 and the second organic film 22, the included angle between the incident light and the normal line of the interface is larger than the included angle between the emergent light and the normal line of the interface, wherein, the inclination angle is equal to the included angle between the array substrate and the eyes of the observer when observing the array substrate.

Figure 3:
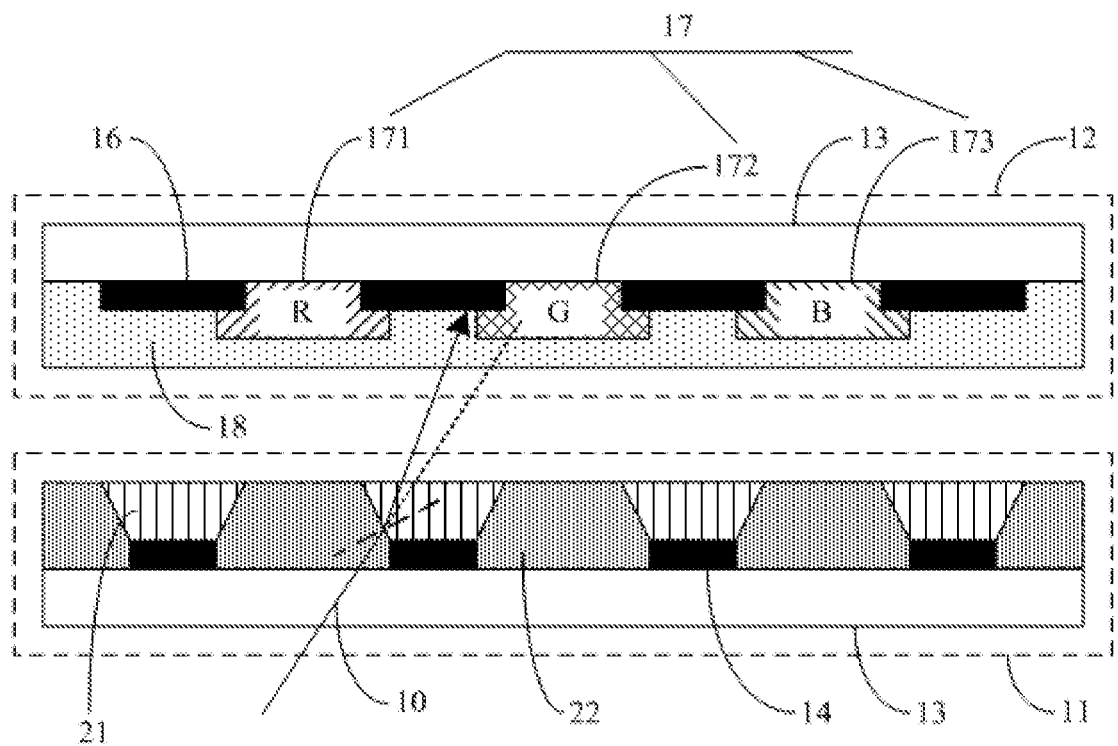
FIG. 3 is a cross-sectional structural schematic diagram of a first type display panel provided by an embodiment of the present disclosure.
Figure 5:
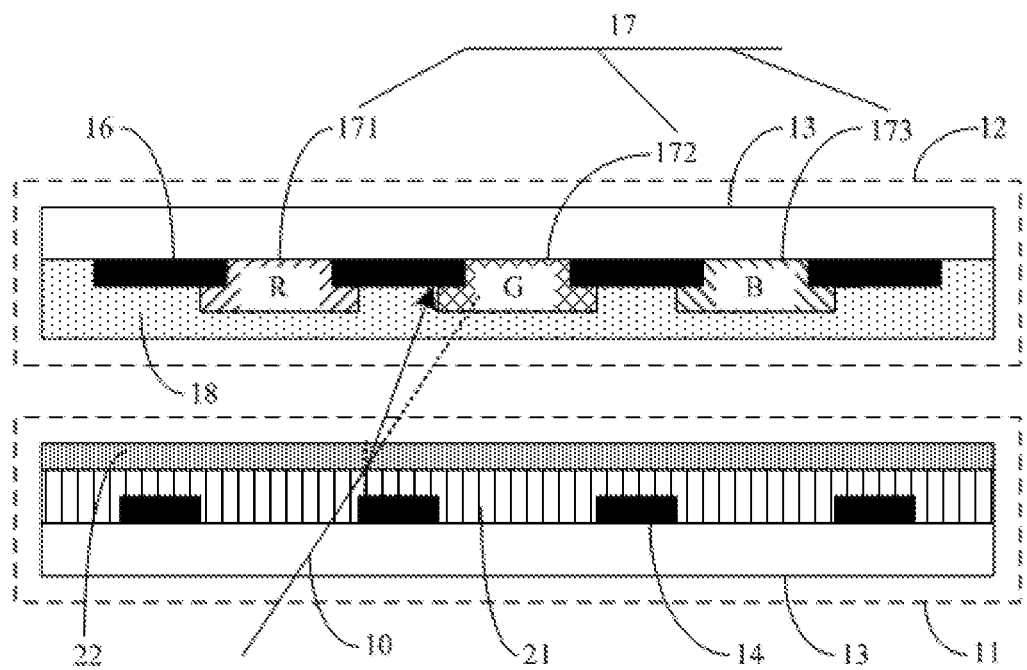
FIG. 5 is a cross-sectional structural schematic diagram of a second type display panel provided by an embodiment of the present disclosure.

As shown in FIG. 3 and FIG. 5, an embodiment of the present disclosure further provides a display panel, including an array substrate 11 and a color filter substrate 12 arranged opposite to each other, wherein, the array substrate 11 is the above-described array substrate provided by the embodiment of the present disclosure, and the color filter substrate 12 is a conventional color filter substrate. Hereinafter, two types of display panels are respectively introduced.

As shown in FIG. 3, when the first organic film 21 and the second organic film 22 included by the array substrate in the embodiment of the present disclosure alternately arranged in contact with each other in a same layer. When an incident light 10 incident into the display region with a certain inclination angle passes through the interface between the first organic film 21 and the second organic film 22 from the second organic film 22 to the first organic film 21, and a direction of the emergent light from the incident light 10 is deflected because the refractive index of the second organic film 22 is greater than the refractive index of the first organic film 21, wherein, the inclination angle is equal to an included angle between the display panel and eyes of an observer when viewing the display panel.

When the observer views the display panel from the front, a light is emitted from a region of an R color filter 171, and a color of an image seen by the observer is red; when the observer, from a side, views the display panel with a certain side viewing angle, the observer receives an emergent light of the incident light which incident into the array substrate with an incident angle the same as the side viewing angle. The embodiment of the present disclosure will be illustrated only with the emergent light of the light 10 in the figure received by the observer as an example.

When the first organic film 21 and the second organic film 22 adopt a same material, that is, the organic films adopt an organic film design in the prior art, after the light 10 passes through the first organic film 21 and the second organic film 22, its direction is not changed, at this time, the emergent light of the light 10 is emitted from the region of the G color filter 172, as shown by a direction of a dotted line in the figure, and colors of the image seen by the observer are red and green, that is, at this time, the cross color defect occurs in the image viewed by the observer.

When the first organic film 21 and the second organic film 22 adopt materials with different refractive indexes, that is, the organic films adopt the organic film design according to the embodiment of the present disclosure, the light 10 passes through the interface between the first organic film 21 and the second organic film 22, and the direction of the emergent light is changed, because the refractive index of the second organic film 22 is greater than the refractive index of the first organic film 21; at the interface between the first organic film 21 and the second organic film 22, the included angle between the incident light of the light 10 and the normal line of the interface is smaller than the included angle between the emergent light of the light 10 and the normal line of the interface. In actual design, by selecting appropriate refractive indexes of the first organic film 21 and the second organic film 22, and by setting an included angle between the interface between the first organic film 21 and the second organic film 22 and a horizontal plane, the emergent light can be emitted to the black matrix, as shown by the solid line with an arrow in the figure. Herein, the emergent light of the light 10 will not be emitted from the region of the G color filter 172, and the color of the image seen by the observer is still red. Therefore, the display panel provided by the embodiment of the present disclosure can effectively prevent generation of the cross color defect at a side viewing angle.

In order to further verify that, as compared with the display panel in the prior art, the display panel provided by the embodiment of the present disclosure can effectively prevent generation of cross color defect at a side viewing angle, in the embodiment of the present disclosure, color gamut of four different types of display panels viewed at an orthographic viewing angle and a side viewing angle are tested.

In the embodiment of the present disclosure, a display panel in the prior art is selected as a first type display panel; a display panel in which the included angle between the horizontal plane and the interface between the first organic film 21 and the second organic film 22 is 30 degrees is selected as a second type display panel, that is, in the second type display panel in the embodiment of the present disclosure, an included angle between the waist of the inverted trapezoid cross-sectional shape of the first organic film 21 on the array substrate and the horizontal direction is 30 degrees, with reference to FIG. 3; a third type display panel in the embodiment of the present disclosure is a display panel in which the included angle between the horizontal plane and the interface between the first organic film 21 and the second organic film 22 is 60 degrees, that is, in the display panel according to the embodiment of the present disclosure, an included angle between the waist of inverted trapezoid cross-sectional shape of the first organic film 21 on the array substrate and the horizontal direction is greater than or equal to 60 degrees; and a display panel in which the included angle between the interface between the first organic film 21 and the second organic film 22 and the horizontal plane is 90 degrees is selected as a fourth type display panel, that is, in the fourth type display panel in the embodiment of the present disclosure, the cross-sectional shape of the first organic film 21 on the array substrate is a rectangle.

Firstly, color gamut of the first type display panel, the second type display panel, the third type display panel and the fourth type display panel are tested respectively when θ=0 degree and Φ=0 degree, and test results show that color gamut of the first type display panel, the second type display panel, the third type display panel and the fourth type display panel is all 70% NTSC, where, θ is an included angle between the eyes of the observer and a direction perpendicular to the display panel, and Φ is a quadrant angle on the display panel. When θ=0 degree and Φ=0 degree, it indicates that the observer is viewing the display panel with an orthographic viewing angle, and, the cross color defect is not apt to occur, and the color gamut of the four types of display panel is the same.

Next, the color gamut of the first type display panel, the second type display panel, the third type display panel and the fourth type display panel are tested respectively when θ=60 degrees and Φ=60 degrees; test results show that the color gamut of the first type display panel is 50% NTSC, the color gamut of the second type display panel is 63% NTSC, the color gamut of the third type display panel is 60% NTSC and the color gamut of the fourth type display panel is 57% NTSC. The test results show that, the smaller the included angle between the interface between the first organic film 21 and the second organic film 22 and the horizontal plane, the slighter the cross color defect. In consideration of limitation of an actual production process, the included angle between the interface between the first organic film 21 and the second organic film 22 and the horizontal plane may be from 30 degrees to 90 degrees; of course, in a case where process accuracy is higher, the included angle between the interface between the first organic film 21 and the second organic film 22 and the horizontal plane may be further set to be smaller than 30 degrees.

As shown in FIG. 5, in the array substrate of the embodiment of the present disclosure, the first organic film 21 and the second organic film 22 included are stacked. When the incident light 10 incident into the display region with a certain inclination angle passes through the interface between the first organic film 21 and the second organic film 22 from the first organic film 21 to the second organic film 22, the direction of the emergent light of the incident light 10 is deflected, because the refractive index of the second organic film 22 is greater than the refractive index of the first organic film 21. Herein, the inclination angle is equal to the included angle between the display panel and the eyes of the observer when viewing the display panel.

According to the above analysis, when the first organic film 21 and the second organic film 22 are made of the same material, after the light 10 passes through the first organic film 21 and the second organic film 22, its direction is not changed; at this time, the emergent light from the light 10 is emitted from the region of the G color filter 172, as shown by a direction of a dotted line in the figure, that is, at this time, the cross color defect occurs in the image viewed by the observer.

When the first organic film 21 and the second organic film 22 are made of materials with different refractive indexes, that is, the organic film adopt the organic film design according to the embodiment of the present disclosure, the light 10 passes through the interface between the first organic film 21 and the second organic film 22, the direction of the emergent light is changed, because the refractive index of the second organic film 22 is greater than the refractive index of the first organic film 21, and the included angle between the incident light of the light 10 and the normal line of the interface is larger than the included angle between the emergent light of the light 10 and the normal line of the interface at the interface between the first organic film 21 and the second organic film 22. In actual design, by selecting appropriate refractive indexes of the first organic film 21 and the second organic film 22, the emergent light can be emitted to the black matrix, as shown by the solid line with an arrow in the figure. The emergent light of the light 10 will not be emitted from the region of the G color filter 172, which can effectively prevent generation of the cross color defect at a side viewing angle.

Embodiment Two

Figure 6:
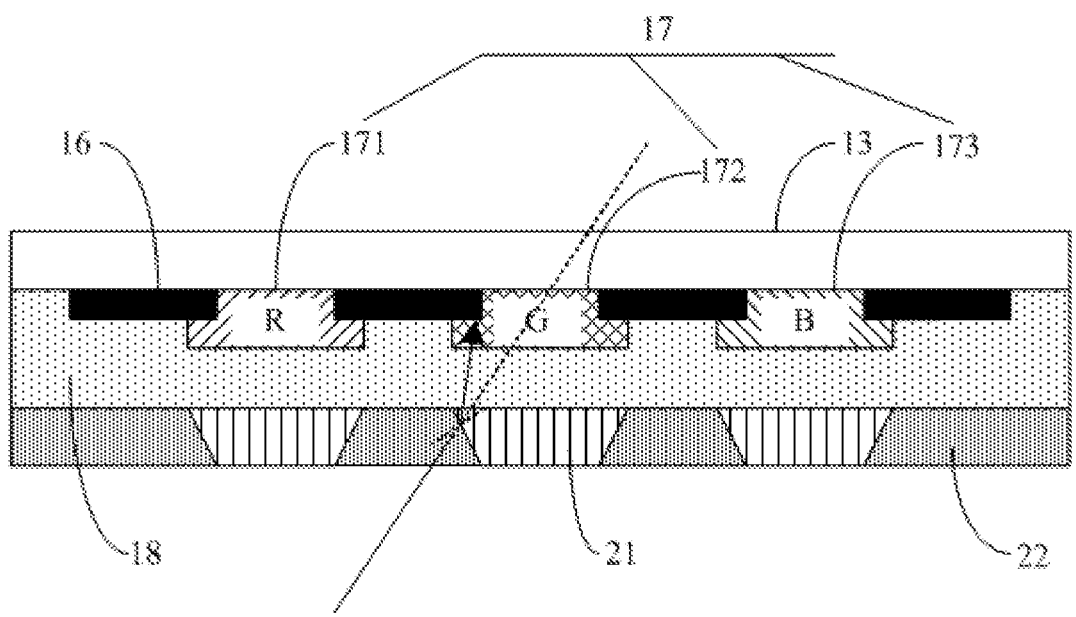
FIG. 6 is a cross-sectional structural schematic diagram of a color filter substrate provided by an embodiment of the present disclosure.
Figure 8:
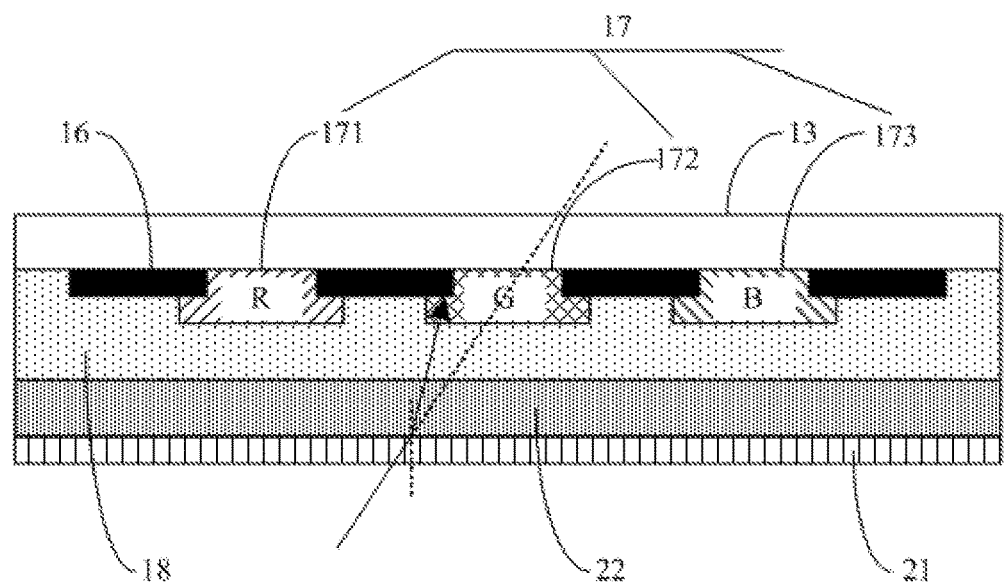
FIG. 8 is a cross-sectional structural schematic diagram of another color filter substrate provided by an embodiment of the present disclosure.

As shown in FIG. 6 and FIG. 8, an embodiment of the present disclosure provides a substrate; the substrate is a color filter substrate, including: a black matrix 16, a color filter layer 17, a protective layer 18, a first organic film 21 and a second organic film 22 located on a base substrate 13. The first organic film 21 and the second organic film 22 are configured to be planarization layers, a refractive index of the first organic film 21 is different from a refractive index of the second organic film 22; and the first organic film 21 and the second organic film 22 are configured such that an emergent light from the incident light obliquely incident into the substrate and passing through an interface between the first organic film 21 and the second organic film 22 is deflected towards a direction away from the substrate Exemplarily, the first organic film 21 and the second organic film 22 in the embodiment of the present disclosure alternately arranged in contact with each other in a same layer; as shown in FIG. 6, the incident light obliquely incident into the color filter substrate is refracted at the interface between the second organic film 22 and the first organic film 21, and the refractive index of the second organic film 22 is larger than the refractive index of the first organic film 21; or, the first organic film 21 and the second organic film 22 in the embodiment of the present disclosure are stacked, as shown in FIG. 8, the incident light obliquely incident into the color filter substrate is refracted at the interface between the first organic film 21 and the second organic film 22, and the refractive index of the second organic film 22 is larger than the refractive index of the first organic film 21.

As shown in FIG. 6, the first organic film 21 and the second organic film 22 in the color filter substrate provided by the embodiment of the present disclosure are configured to be planarization layers, for playing a role in planarization when an alignment film is fabricated subsequent to the color filter substrate, so that the alignment film fabricated has a better performance. When an incident light incident into a region corresponding to the color filter layer 17 with a certain inclination angle passes through the interface between the first organic film 21 and the second organic film 22, an included angle between the incident light and a normal line of the interface is smaller than an included angle between an emergent light and the normal line of the interface, wherein, the inclination angle is equal to an included angle between the color filter substrate and the eyes of the observer when observing the color filter substrate.

Exemplarily, when the first organic film 21 and the second organic film 22 in the embodiment of the present disclosure alternately arranged in contact with each other in a same layer, because the first organic film 21 and the second organic film 22 in the embodiment of the present disclosure have different refractive indexes, a light incident into the color filter substrate, when passing through the interface between the first organic film 21 and the second organic film 22, will generate a refraction phenomenon, so that the propagation direction of the light incident into the color filter substrate is changed.

Exemplarily, as shown in FIG. 6, in the embodiment of the present disclosure, a region of the second organic film 22 is provided corresponding to a black matrix region, and a region of the first organic film 21 is provided corresponding to a region outside the black matrix region. When the base substrate 13 is located at the bottom, a cross-sectional shape of the first organic film 21 in the embodiment of the present disclosure is a trapezoid, and an included angle between a waist of the trapezoid and a horizontal direction is greater than or equal to 30 degrees. In actual design, the trapezoid is designed as an isosceles trapezoid. In actual design, a cross-sectional shape of the first organic film 21 in the specific embodiment of the present disclosure may also be a rectangle.

Exemplarily, when the first organic film 21 and the second organic film 22 according to the embodiment of the present disclosure are stacked, as shown in FIG. 8, in the specific embodiment of the present disclosure, the first organic film 21 covers the second organic film 22; exemplarily, in the embodiment of the present disclosure, an orthographic projection of the first organic film 21 on the base substrate 13 and an orthographic projection of the second organic film 22 on the base substrate 13 are the same in area; and of course, in actual design, the orthographic projection of the first organic film 21 on the base substrate 13 and the orthographic projection of the second organic film 22 on the base substrate 13 may also be different in area.

The second organic film 22 in the embodiment of the present disclosure is configured to be a planarization layer, so that the first organic film 21 subsequently formed has a better performance; and the first organic film 21 is configured to be a planarization layer, so that an alignment film subsequently formed has a better performance. When the incident light incident into the color filter substrate with a certain inclination angle passes through the interface between the first organic film 21 and the second organic film 22, the included angle between the incident light and the normal line of the interface is larger than the included angle between the emergent light and the normal line of the interface.

Figure 7:
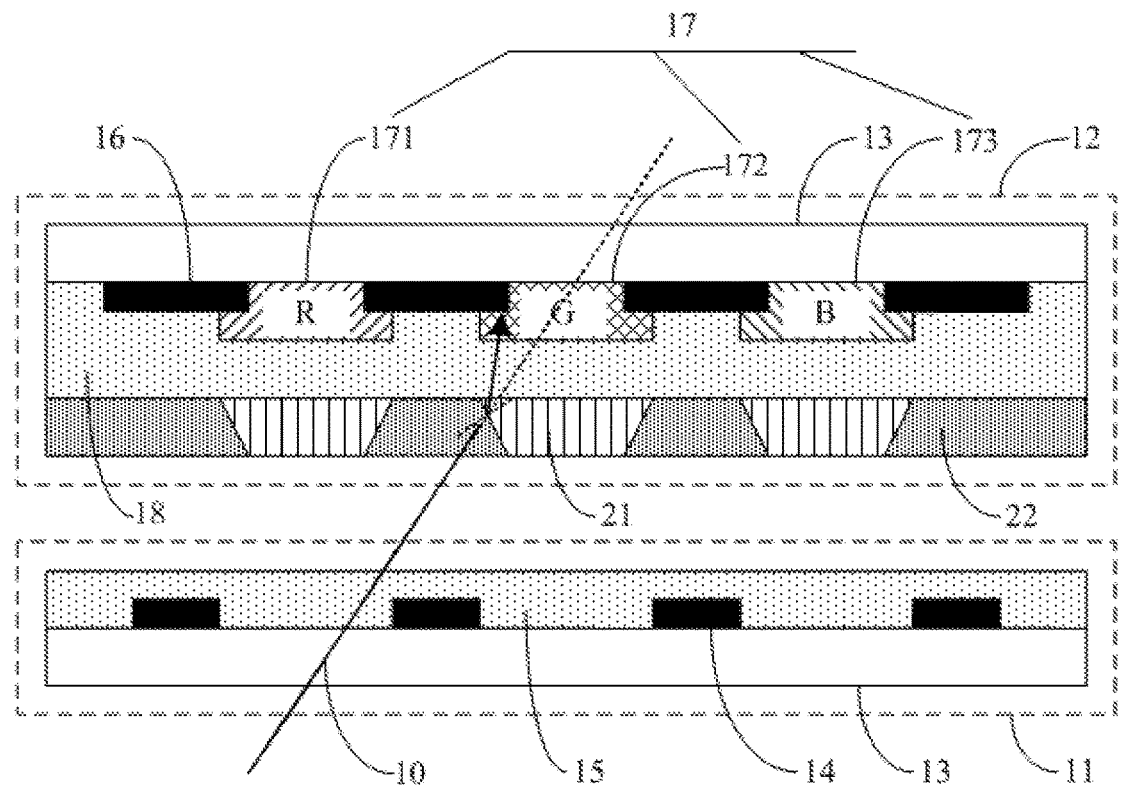
FIG. 7 is a cross-sectional structural schematic diagram of a third type display panel provided by an embodiment of the present disclosure.
Figure 9:
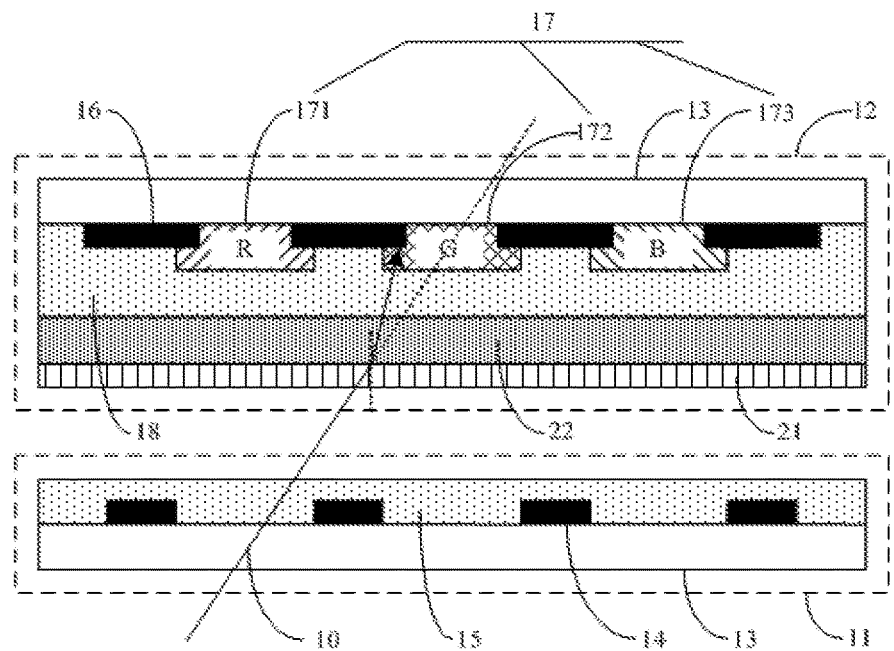
FIG. 9 is a cross-sectional structural schematic diagram of a fourth type display panel provided by an embodiment of the present disclosure.

As shown in FIG. 7 and FIG. 9, an embodiment of the present disclosure further provides a display panel, including an array substrate 11 and a color filter substrate 12 arranged opposite to each other, wherein, the array substrate 11 is a conventional array substrate, and the color filter substrate 12 is the above-described color filter substrate provided by the embodiment of the present disclosure. Hereinafter, the two types of display panels are respectively described.

As shown in FIG. 7, the first organic film 21 and the second organic film 22 included in the color filter substrate in the embodiment of the present disclosure are alternately arranged in contact with each other in a same layer. When an incident light 10 incident into the color filter substrate with a certain inclination angle passes through the interface between the first organic film 21 and the second organic film 22 from the second organic film 22 to the first organic film 21, a direction of the emergent light of the incident light 10 is deflected because the refractive index of the second organic film 22 is greater than the refractive index of the first organic film 21, wherein, the inclination angle is equal to an included angle between the display panel and the eyes of an observer when viewing the display panel.

In the embodiment of the present disclosure, when the light 10 incident into the color filter substrate passes through the interface between the first organic film 21 and the second organic film 22, the direction of the emergent light is changed, because the refractive index of the second organic film 22 is greater than the refractive index of the first organic film 21, and the included angle between the incident light of the light 10 and the normal line of the interface is smaller than the included angle between the emergent light of the light 10 and the normal line of the interface at the interface between the first organic film 21 and the second organic film 22. In actual design, by selecting appropriate refractive indexes of the first organic film 21 and the second organic film 22, and by setting an appropriate included angle between the interface between the first organic film 21 and the second organic film 22 and a horizontal plane, the emergent light can be emitted to the black matrix, as shown by the solid line with an arrow in the figure. Herein, the emergent light from the light 10 will not be emitted from the region of the G color filter 172, which can effectively prevent generation of the cross color defect at a side viewing angle. In an actual production process, since the light 10 is closer to the color filter layer 17, in order to better prevent generation of the cross color defect at a side viewing angle, in the embodiment of the present disclosure, it is necessary to make a thickness of the protective layer 18 greater, but a greater thickness of the protective layer 18 is liable to cause problems that a film layer falls off and a thickness of the display panel is increased, and thus, in the actual production process, it is necessary to fabricate the protective layer 18 within a certain range of thickness, and the range of thickness needs to be determined according to a specific production process.

As shown in FIG. 9, when the first organic film 21 and the second organic film 22 included in the array substrate of the embodiment of the present disclosure are stacked. When the incident light 10 incident into the color filter substrate with a certain inclination angle passes through the interface between the first organic film 21 and the second organic film 22 from the first organic film 21 to the second organic film 22, the direction of the emergent light of the incident light 10 is deflected because the refractive index of the second organic film 22 is greater than the refractive index of the first organic film 21, wherein, the inclination angle is equal to the included angle between the display panel and the eye of the observer when viewing the display panel.

In the embodiment of the present disclosure, when the light 10 incident into the color filter substrate passes through the interface between the first organic film 21 and the second organic film 22, the direction of the emergent light is changed, because the refractive index of the second organic film 22 is greater than the refractive index of the first organic film 21 and the included angle between the incident light of the light 10 and the normal line of the interface is larger than the included angle between the emergent light of the light 10 and the normal line of the interface at the interface between the first organic film 21 and the second organic film 22, and. In actual design, by selecting appropriate refractive indexes of the first organic film 21 and the second organic film 22, the emergent light can be emitted to the black matrix, as shown by the solid line with an arrow in the figure. Herein, the emergent light of the light 10 will not be emitted from the region of the G color filter 172, which can effectively prevent generation of the cross color defect at a side viewing angle.

Figure 10:
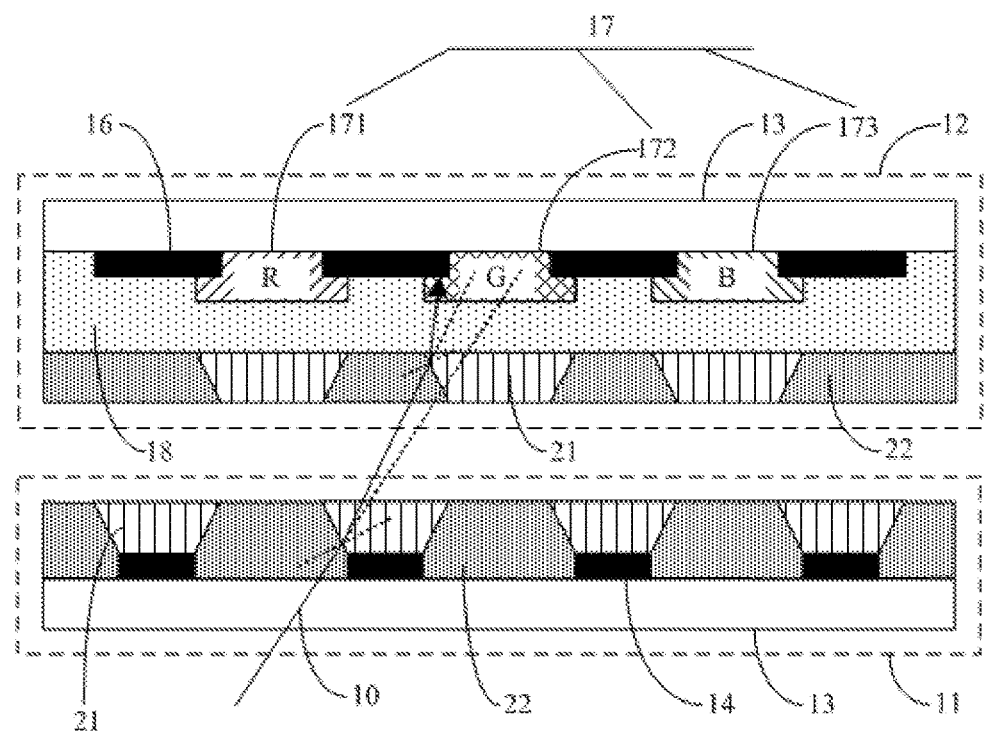
FIG. 10 is a cross-sectional structural schematic diagram of a fifth type display panel provided by an embodiment of the present disclosure.

As shown in FIG. 10, the display panel provided by the embodiment of the present disclosure includes an array substrate 11 and a color filter substrate 12 arranged opposite to each other, wherein, the array substrate 11 is the above-described array substrate provided by the embodiment of the present disclosure, and the color filter substrate 12 is the above-described color filter substrate provided by the embodiment of the present disclosure. FIG. 10 only shows one of the display panels. From the figure, it can be seen that the display panel in the embodiment of the present disclosure can allow a large portion of light incident into the display panel with a predetermined inclination angle to be irradiated onto the black matrix, so as to effectively prevent generation of the cross color defect at a side viewing angle.

An embodiment of the present disclosure further provides a display device, the display device comprising the above-described display panel, and the display device can be a liquid crystal panel, a liquid crystal display, a liquid crystal television, an Organic Light Emitting Display (OLED) panel, an OLED display, an OLED television, E-paper, and the like.

An embodiment of the present disclosure further provides a fabrication method of a substrate, the method comprising: forming a first organic film and a second organic film on a base substrate, the first organic film and the second organic film being configured to be planarization layers, a refractive index of the first organic film being different from a refractive index of the second organic film; the first organic film and the second organic film being configured such that an emergent light from the incident light obliquely incident into the substrate and passing through an interface between the first organic film and the second organic film is deflected towards a direction away from the substrate.

Figure 11A:
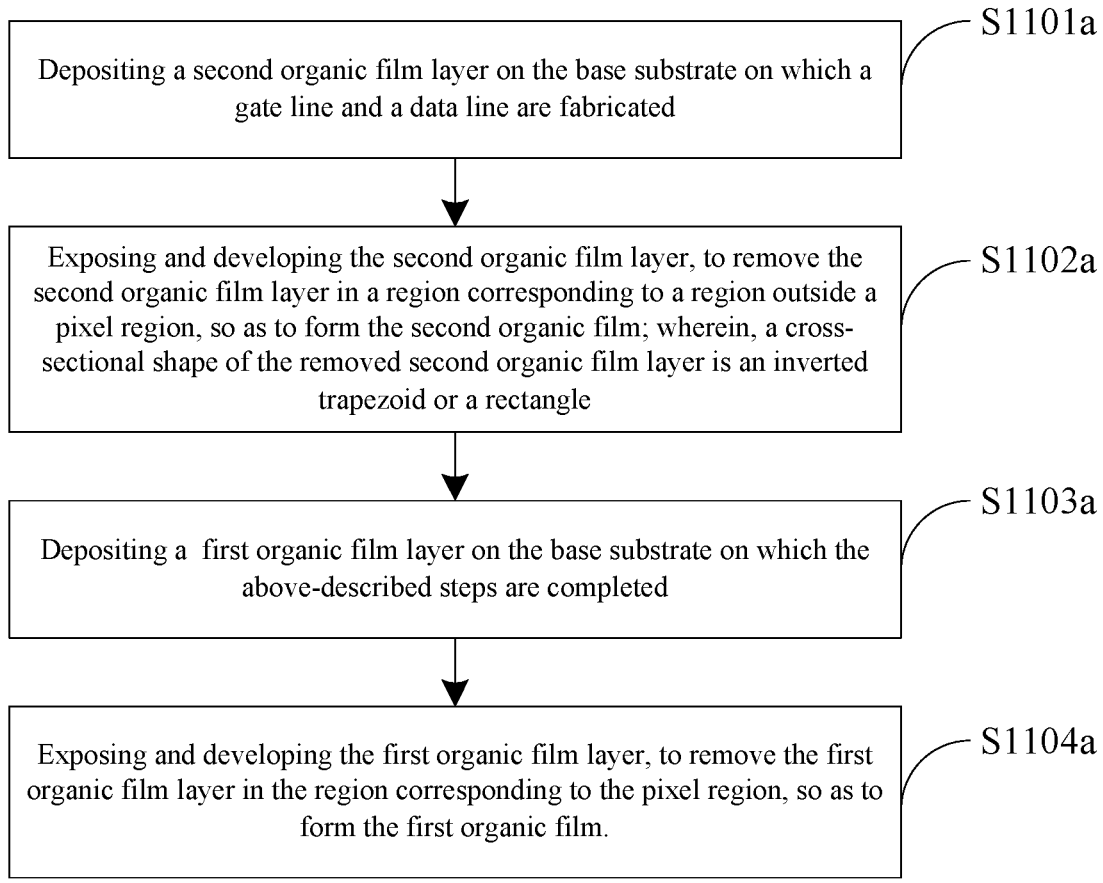
FIG. 11(a) and FIG. 11(b) are flowcharts of a fabrication method of a first organic film and a second organic film when the substrate provided by the embodiment of the present disclosure is an array substrate.
Figure 11B:
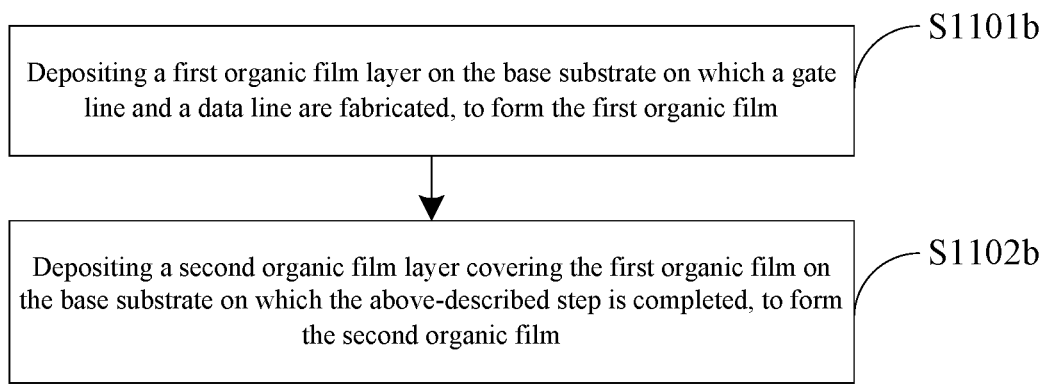

Exemplarily, as shown in FIG. 11(*a*), when the substrate in the embodiment of the present disclosure is an array substrate, the forming a first organic film and a second organic film may include:

S1101*a*: depositing a second organic film layer on the base substrate on which a gate line and a data line are formed;

S1102*a*: exposing and developing the second organic film layer, to remove the second organic film layer in a region corresponding to a region outside a pixel region, so as to form the second organic film; wherein, a cross-sectional shape of the removed second organic film layer is an inverted trapezoid or a rectangle;

S1103*a*: depositing a first organic film layer on the base substrate on which the above-described steps are completed;

S1104*a*: exposing and developing the first organic film layer, to remove the first organic film layer in the region corresponding to the pixel region, so as to form the first organic film.

Exemplarily, as shown in FIG. 11(*b*), when the substrate in the embodiment of the present disclosure is an array substrate, the forming a first organic film and a second organic film may include:

S1101*b*: depositing a first organic film layer on the base substrate on which a gate line and a data line are formed, to form the first organic film;

S1102*b*: depositing a second organic film layer covering the first organic film on the base substrate on which the above-described step is completed, to form the second organic film.

The first organic film and the second organic film formed by using the fabrication method as shown in FIG. 11(*a*) in the embodiment of the present disclosure are alternately arranged in contact with each other in a same layer; and the first organic film and the second organic film formed by using the fabrication method as shown in FIG. 11(*b*) are stacked.

Hereinafter, the fabrication method of the array substrate provided by the embodiment of the present disclosure will be described in detail in conjunction with the accompanying drawings; hereinafter, only the fabrication method when the first organic film and the second organic film alternately arranged in contact with each other in a same layer is introduced; the fabrication method when the first organic film and the second organic film are stacked is relatively simple, which is similar to a method for forming the planarization layer in the prior art, and will not be described in detail here.

Figure 12:
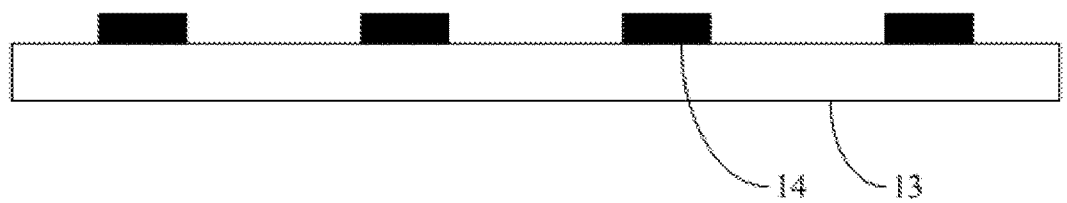
FIG. 12 to FIG. 15 are structural schematic diagrams of respective stages of a fabrication process of an array substrate provided by an embodiment of the present disclosure.

Firstly, as shown in FIG. 12, structures such as a gate electrode, a gate line, a data line and a source/drain electrode are formed on the base substrate by patterning processes. Only the data line 14 fabricated is shown in the figure. The method for fabricating the structures such as the gate electrode, the gate line, the data line and the source/drain electrode in the embodiment of the present disclosure is the same as that of the prior art, and will not be repeated here.

Figure 13:
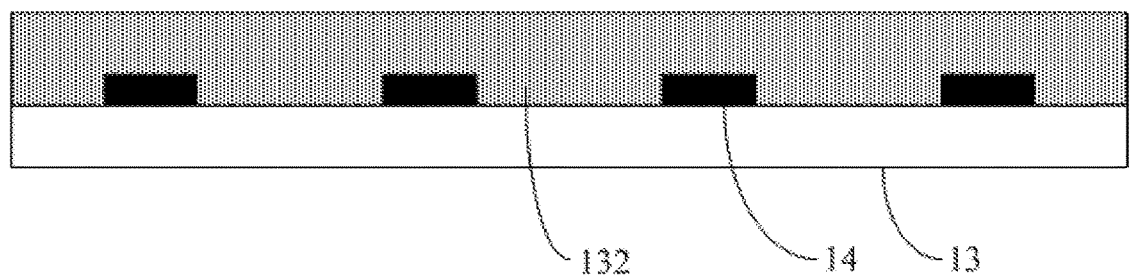

Next, as shown in FIG. 13, a second organic film layer 132 is deposited on the base substrate on which the gate line and the data line 14 are formed. The deposition method of the second organic film layer 132 can be a method such as coating, and an exemplary deposition method of the second organic film layer 132 is the same as the method for depositing the organic film layer of a technology known by the inventor, which will not be repeated here.

Figure 14:
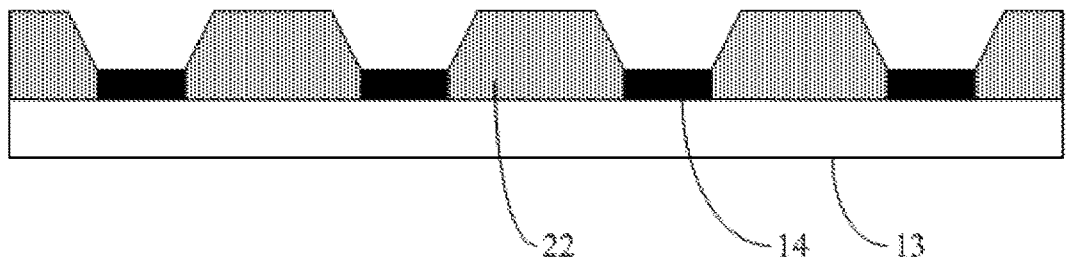

Next, as shown in FIG. 14, the second organic film layer 132 is exposed and developed, the second organic film layer of the region corresponding to the region outside the pixel region is removed, and the second organic film 22 is formed; wherein, the cross-sectional shape of the removed second organic film layer is presented as an inverted trapezoid. Therein, in an actual production process, the second organic film layer 132 can be exposed by a designed pattern on a mask, and by settings of respective parameters in the exposure process, so that a cross-sectional shape of the second organic film layer removed by exposure and then development is presented as an inverted trapezoid.

Figure 15:
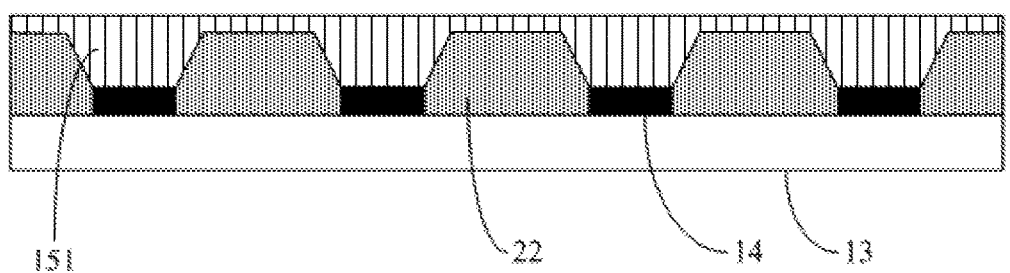

Next, as shown in FIG. 15, a first organic film layer 151 is deposited on the base substrate on which the above-described steps are completed, and a deposition method of the first organic film layer 151 is same as the deposition method of the second organic film layer 132. Next, the deposited first organic film layer 151 is exposed and developed, the first organic film layer in the region corresponding to the pixel region is removed, and the first organic film 21 is formed, as shown in FIG. 2.

Finally, structures such as a pixel electrode and a passivation layer are formed by patterning process on the base substrate on which the above-described steps are completed; and the fabrication method of the pixel electrode and the passivation layer in the embodiment of the present disclosure is the same as that of the prior art, which will not be repeated here.

Figure 16A:
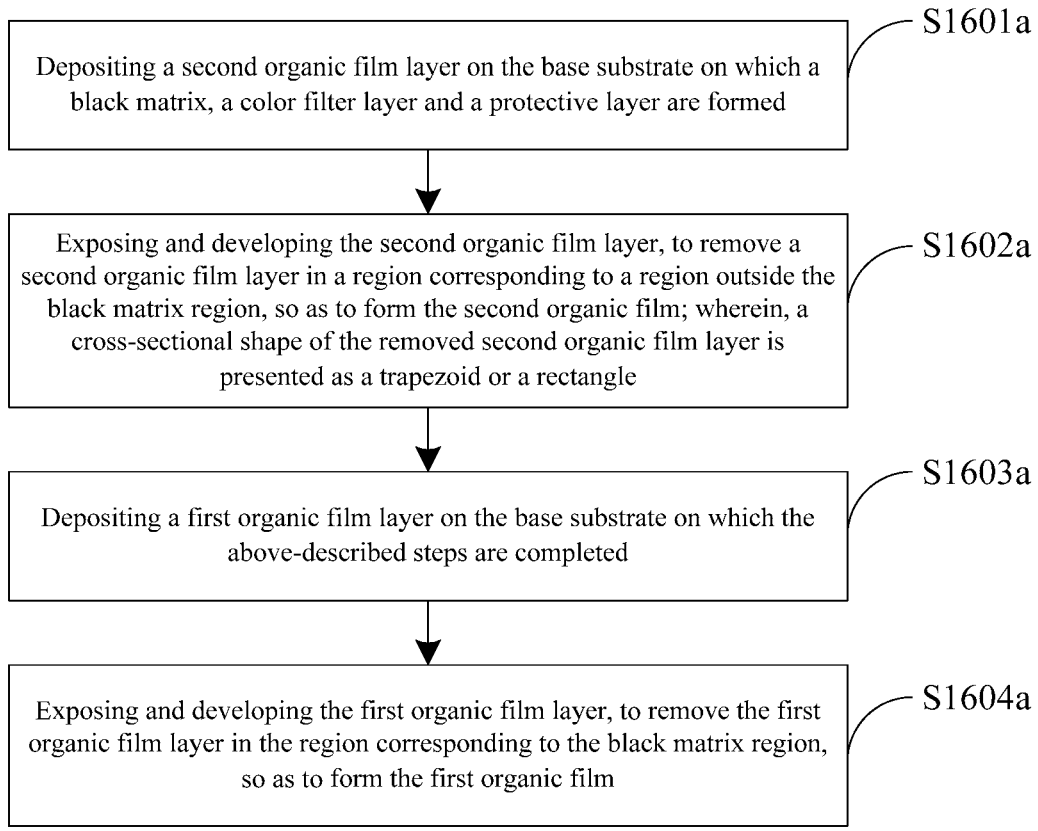
FIG. 16(a) and FIG. 16(b) are flowcharts of a fabrication method of a first organic film and a second organic film when the substrate provided by the embodiment of the present disclosure is a color filter substrate.

Exemplarily, as shown in FIG. 16(a), when the substrate in the embodiment of the present disclosure is a color filter substrate, the forming a first organic film and a second organic film can include:

S1601a: depositing a second organic film layer on the base substrate on which a black matrix, a color filter layer and a protective layer are fabricated;

S1602a: exposing and developing the second organic film layer, to remove a second organic film layer in a region corresponding to a region outside the black matrix region, so as to form the second organic film; wherein, a cross-sectional shape of the removed second organic film layer is presented as a trapezoid or a rectangle;

S1603a: depositing a first organic film layer on the base substrate on which the above-described steps are completed;

S1604a: exposing and developing the first organic film layer, to remove the first organic film layer in the region corresponding to the black matrix region, so as to form a first organic film.

Figure 16B:
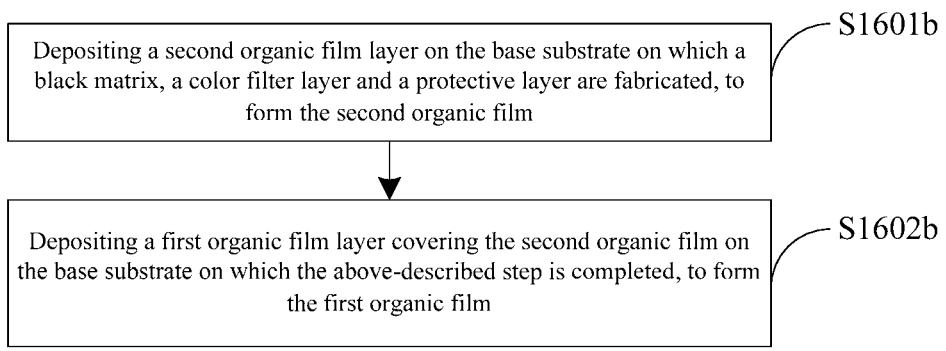

Exemplarily, as shown in FIG. 16(b), when the substrate in the embodiment of the present disclosure is a color filter substrate, the forming a first organic film and a second organic film may include:

S1601b: depositing a second organic film layer on the base substrate on which a black matrix, a color filter layer and a protective layer are formed, to form the second organic film;

S1602b: depositing a first organic film layer covering the second organic film on the base substrate on which the above-described step is completed, to form the first organic film.

The first organic film and the second organic film formed by the fabrication method as shown in FIG. 16(a) in the embodiment of the present disclosure are alternately arranged in contact with each other in a same layer; and the first organic film and the second organic film formed by the fabrication method as shown in FIG. 16(b) are stacked.

The forming a first organic film and a second organic film when the substrate according to the embodiment of the present disclosure is a color filter substrate is similar to the forming a first organic film and a second organic film when the substrate according to the embodiment of the present disclosure is an array substrate, which will not be repeated here.

In summary, the embodiments of the present disclosure provide the substrate and the fabrication method thereof, the display panel and the display device; the substrate includes a first organic film and a second organic film located on a base substrate; the first organic film and the second organic film are configured to be the planarization layers; the refractive index of the first organic film is different from the refractive index of the second organic film; the first organic film and the second organic film are configured such that an emergent light from the incident light obliquely incident into the substrate and passing through an interface between the first organic film and the second organic film is deflected towards a direction away from the substrate. When the display panel is formed by using the substrate provided by the embodiment of the present disclosure, and when the observer views the display panel with a certain side viewing angle, since the first organic film and the second organic film of the substrate provided by the embodiment of the present disclosure are used such that an emergent light from the incident light obliquely incident into the substrate and passing through an interface between the first organic film and the second organic film is deflected towards a direction away from the substrate, as compared with the conventional display panel, by selecting the organic films of different refractive indexes, the propagation direction of the light incident can be changed, so that further a large portion of the light incident on the substrate in the embodiment of the present disclosure is irradiated onto the black matrix, so as to effectively prevent generation of the cross color defect at a side viewing angle.

It is evident that a person skilled in the art can make various changes or modifications to the present disclosure without departing from the spirit and scope of the present disclosure. Thus, if such changes and modifications to the present disclosure are within the scope of the claims of the present disclosure and equivalent thereof, the present disclosure also intends to include all such changes and modifications within its scope.

The present application claims priority of Chinese Patent Application No. 201510518760.6 filed on Aug. 21, 2015, the present disclosure of which is incorporated herein by reference in its entirety as part of the present application.

The invention claimed is:

1. A substrate, comprising:
    a base substrate; and
    a first organic film and a second organic film, located on the base substrate and configured to be planarization layers, a refractive index of the first organic film being different from that of the second organic film,
    wherein the first organic film and the second organic film are configured such that an emergent light from incident light obliquely incident into the substrate and passing through an interface between the first organic film and the second organic film is deflected towards a direction away from the substrate, and
    the first organic film and the second organic film are stacked in a manner of one covering another, and an orthographic projection of the first organic film on the base substrate and an orthographic projection of the second organic film on the base substrate are completely overlapped with each other.

2. The substrate according to claim 1, wherein the substrate is an array substrate or a color filter substrate.

3. The substrate according to claim 1, wherein, the incident light is inclined towards an edge of the substrate, the first organic film and the second organic film are configured such that the emergent light from the incident light obliquely incident into the substrate and passing through the interface between the first organic film and the second organic film is deflected, relative to the incident light, towards another edge of the substrate opposite to the edge.

4. A display panel, wherein the display panel comprises the substrate according to claim 1.

5. A display device, wherein the display device comprises the display panel according to claim 4.

6. The substrate according to claim 1, wherein when the substrate is an array substrate, the second organic film covers the first organic film, and the refractive index of the second organic film is larger than the refractive index of the first organic film.

7. The substrate according to claim 1, wherein when the substrate is a color filter substrate, the first organic film covers the second organic film, and the refractive index of the second organic film is larger than the refractive index of the first organic film.

8. A fabrication method of a substrate, comprising:

providing a base substrate; and forming a first organic film and a second organic film on the base substrate, wherein the first organic film and the second organic film are configured to be planarization layers, and a refractive index of the first organic film is different from that of the second organic film, wherein the first organic film and the second organic film are configured such that an emergent light from the incident light obliquely incident into the substrate and passing through an interface between the first organic film and the second organic film is deflected towards a direction away from the substrate, and wherein the first organic film and the second organic film are stacked in a manner of one covering another, and an orthographic projection of the first organic film on the base substrate and an orthographic projection of the second organic film on the base substrate are completely overlapped with each other.

9. The method according to claim 8, wherein the substrate is an array substrate or a color filter substrate.

10. The method according to claim 9, wherein when the substrate is an array substrate, the forming the first organic film and the second organic film on the base substrate includes:

depositing a first organic film layer on the base substrate with a gate line and a data line formed thereon, to form the first organic film; and depositing a second organic film layer covering the first organic film on the base substrate on which the above-described step is completed, to form the second organic film, wherein the refractive index of the second organic film is larger than that of the first organic film.

11. The method according to claim 9, wherein when the substrate is a color filter substrate, the forming the first organic film and the second organic film on the base substrate includes:

depositing a second organic film layer on the base substrate with a black matrix, a color filter layer, and a protective layer formed thereon, to form the second organic film; and depositing a first organic film layer covering the second organic film on the base substrate on which the above-described step is completed, to form the first organic film, wherein the refractive index of the second organic film is larger than that of the first organic film.

12. The method according to claim 8, wherein the incident light is inclined towards an edge of the substrate, the first organic film and the second organic film are configured such that the emergent light from the incident light obliquely incident into the substrate and passing through the interface between the first organic film and the second organic film is deflected, relative to the incident light, towards another edge of the substrate opposite to the edge.

\* \* \* \* \*